United States Patent
Bonella et al.

(12) 
(10) Patent No.: US 6,369,605 B1
(45) Date of Patent: Apr. 9, 2002

(54) SELF-TERMINATED DRIVER TO PREVENT SIGNAL REFLECTIONS OF TRANSMISSIONS BETWEEN ELECTRONIC DEVICES

(75) Inventors: Randy Bonella, Portland; John Halbert, Beaverton, both of OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/664,994

(22) Filed: Sep. 18, 2000

(51) Int. Cl.[7] .............................................. H03K 17/16
(52) U.S. Cl. .............................. 326/30; 326/86; 326/90
(58) Field of Search ............................... 326/30, 56–58, 326/83, 86, 90

(56) References Cited

U.S. PATENT DOCUMENTS

| | | | |
|---|---|---|---|
| 5,528,168 A | * 6/1996 | Kleveland | 326/30 |
| 5,592,509 A | * 1/1997 | McClear et al. | 375/219 |
| 5,936,429 A | * 8/1999 | Tomita | 326/82 |
| 5,955,894 A | * 9/1999 | Vishwanthaiah et al. | 326/86 |
| 6,169,418 B1 | * 1/2001 | Wagner | 326/41 |

* cited by examiner

*Primary Examiner*—Michael Tokar
*Assistant Examiner*—Vibol Tan
(74) *Attorney, Agent, or Firm*—Blakely, Sokoloff, Taylor & Zafman LLP

(57) ABSTRACT

An output driver circuit within an electronic device to provide a configurable driver circuit. When placed in a first mode of operation, the driver circuit drives an output signal. When placed in a second mode of operation, the driver circuit provides impedance matching to prevent signal reflection.

29 Claims, 9 Drawing Sheets

| A | Enable | Control | B |
|---|---|---|---|
| 1 | 1 | 0 | 1 |
| 0 | 1 | 0 | 0 |
| X | 0 | 1 | Termination Impedance |

Legend:
Boolean logic state 1 - HIGH
Boolean logic state 0 - LOW
Neither HIGH nor LOW represent particular voltage levels.

Termination Impedance (network impedance)
is determined by the ratio of the P-channel and
N-channel field-effect transistors and the sizes
of those transistors.

Figure 8

SELF-TERMINATED DRIVER TO PREVENT SIGNAL REFLECTIONS OF TRANSMISSIONS BETWEEN ELECTRONIC DEVICES

FIELD

The invention relates to a method and apparatus for preventing signal reflection of transmissions between electronic devices by employing a configurable, self-terminated driver.

GENERAL BACKGROUND

As faster and more complex electrical circuits are designed, one challenge is to fit an ever increasing number of components into smaller form-factor devices. The increasing number of components also causes the price of high density circuits to increase. Therefore, it is desirable to make the most effective use of every component utilized without affecting the operation of the circuit.

Presently, electronic devices, such as semiconductor integrated circuits, are typically mounted on a circuit substrate and electrically interconnected to perform a practical function. As transmission speeds between such devices increase, it is desirable that a transmission path have evenly matched impedance. A problem that occurs if impedance is not evenly matched along a transmission path is signal reflection. Signal reflection occurs where a transmission signal crosses from a first transmission medium to a second transmission medium having different characteristic impedance. As transmission frequencies increase, the disruption of signal waveforms caused by such reflection becomes more problematic.

Typically, signal transmission without reflection is achieved by coupling a termination resistor equal to the characteristic impedance of the signal transmission line at either the receiving end, the transmitting end, or both. This technique is also commonly known as "impedance matching". The termination resistor may be coupled to a voltage source ("pulled up") or coupled to ground (pulled down).

As shown in FIG. 1, the transmission path between two devices 102 & 104, such as two semiconductor integrated circuits, is made up of a conductor 110 which has a distributed characteristic impedance $Z_O$. However, the node 106 where such conductor couples to the device pins can be a source of signal reflection. Therefore, a termination resistor 108, with a matching impedance $Z_O$, is coupled to the receiving end of the transmission path 106 at one end and to ground at the other end. This causes the transmitted signal to be absorbed by the termination resistor 108 at the receiving end, producing no reflection. The receiving device thus receives the transmitted signal without disruption of the signal waveforms.

In preventing signal reflection, it is essential that the resistance of the termination resistor 108 exactly match the characteristic impedance $Z_O$ of the signal transmission path or conductor 110. Because such high accuracy is required when matching a resistor to the transmission line, terminating resistors are not typically placed within semiconductor integrated circuits. That is, since the characteristic impedance of transmission lines, or conductors, can vary from application to application, placing terminating resistors within an integrated circuit is not advisable because they may not be a good match with the transmission lines utilized. Placing termination resistors within integrated circuits also increases the cost of such devices. Therefore, termination resistors are commonly mounted outside the semiconductor integrated circuit as shown in FIG. 1.

One disadvantage of utilizing external termination resistors is that as the number of signal paths between devices increases, the number of termination resistors required also increases, requiring an increased area for their mounting. This presents a problem in achieving higher density, small form-factor devices such as computer memory modules.

Computer memory devices is one area where impedance matching is necessary but additional components are undesirable. Computer memory architectures commonly require impedance matching to minimize reflections at higher frequencies. FIG. 2 is a high-level schematic of a conventional computer memory architecture. A controller 202 manages communications with a plurality of memory modules 204. Note that, typically, communications between a controller and memory devices are carried out over a bus 206. The bus 206 consists of a plurality of individual transmission lines.

FIG. 3 provides more details as to the typical placement of termination resistors in the computer memory architecture of FIG. 2. A single memory module 204 and a single transmission line 206 is shown in FIG. 3 for simplicity. Termination resistors 210 are coupled to each transmission line or conductor 206 near the node where the transmission line couples with an electronic device 202, 212 & 214. Electronic devices typically found in memory modules include memory components to store data, such as dynamic random access memory (DRAM) 214, and buffers 212 that act as an interface between the bus and the memory devices. At each node where a transmission line couples to a device, a termination resistor 210 is necessary to avoid signal reflection. Termination resistors 210 thus add to the cost of memory modules 204 and make it more difficult to design memory modules with small form factors.

BRIEF DESCRIPTION OF THE DRAWINGS

FIG. 8 is a table describing the operation of the circuit in FIG. 7.

DETAILED DESCRIPTION OF THE INVENTION

The present invention provides a method and apparatus by which to provide a configurable driver circuit which in a first operational mode can drive an output signal and in a second operational mode can provide impedance matching to prevent signal reflection.

Figure 1:
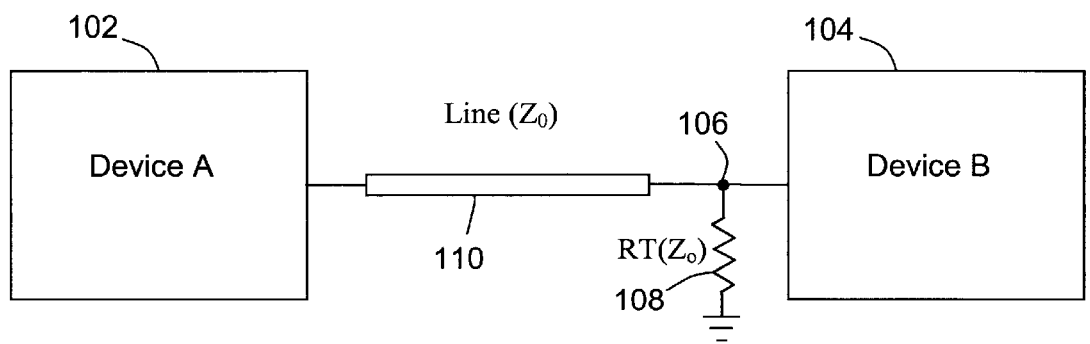
FIG. 1 is an illustration of a transmission line between two electronic devices with external termination impedance.
Figure 2:
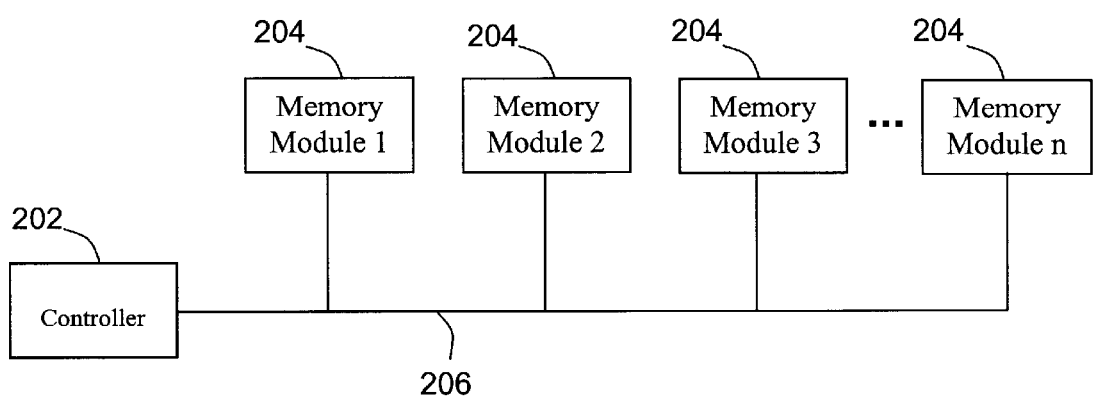
FIG. 2 is a system-level illustration of a prior art computer memory architecture.
Figure 3:
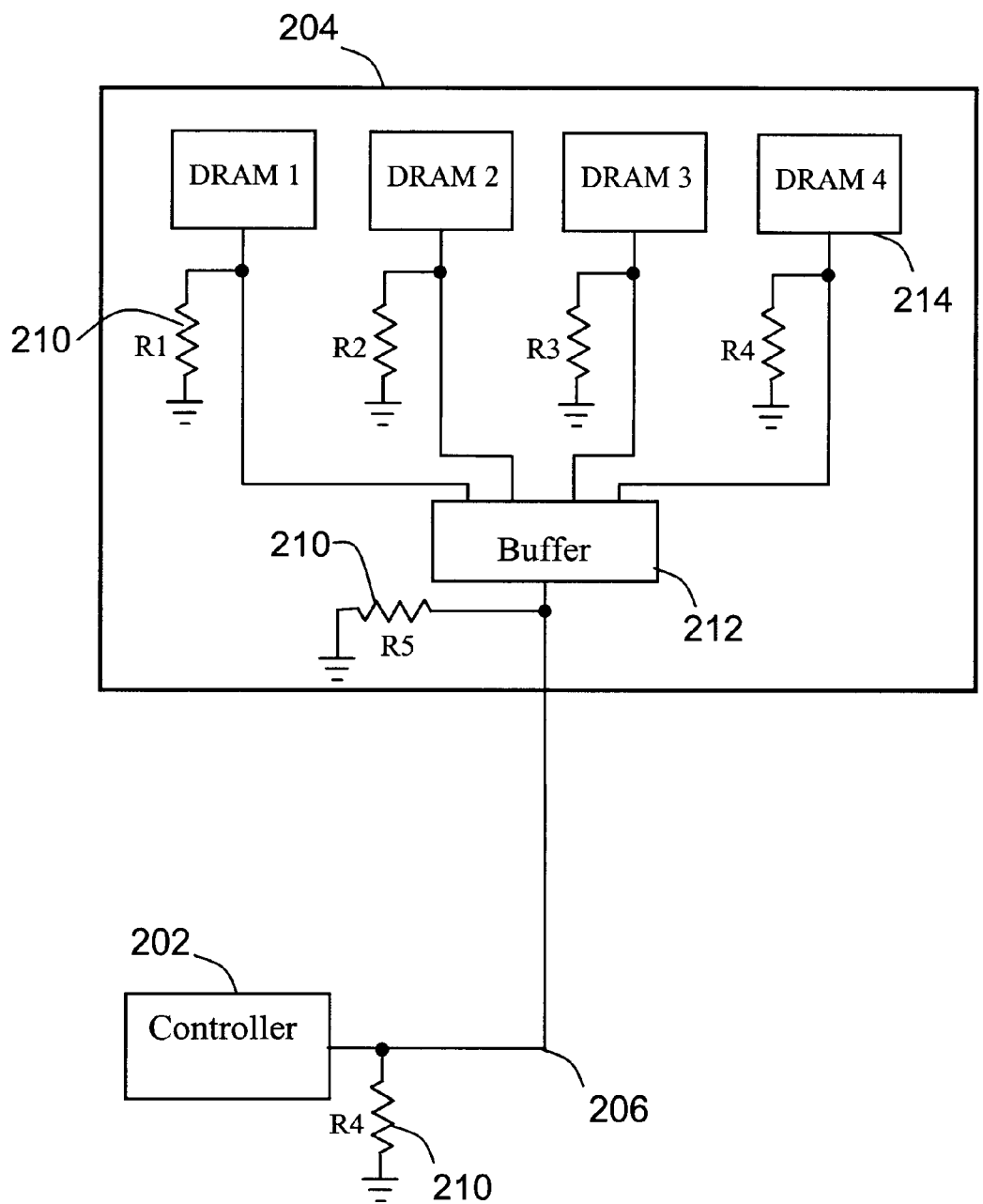
FIG. 3 is a system-level schematic illustrating a conventional prior art memory module with its sub-components and a memory controller with termination impedance.
Figure 4:
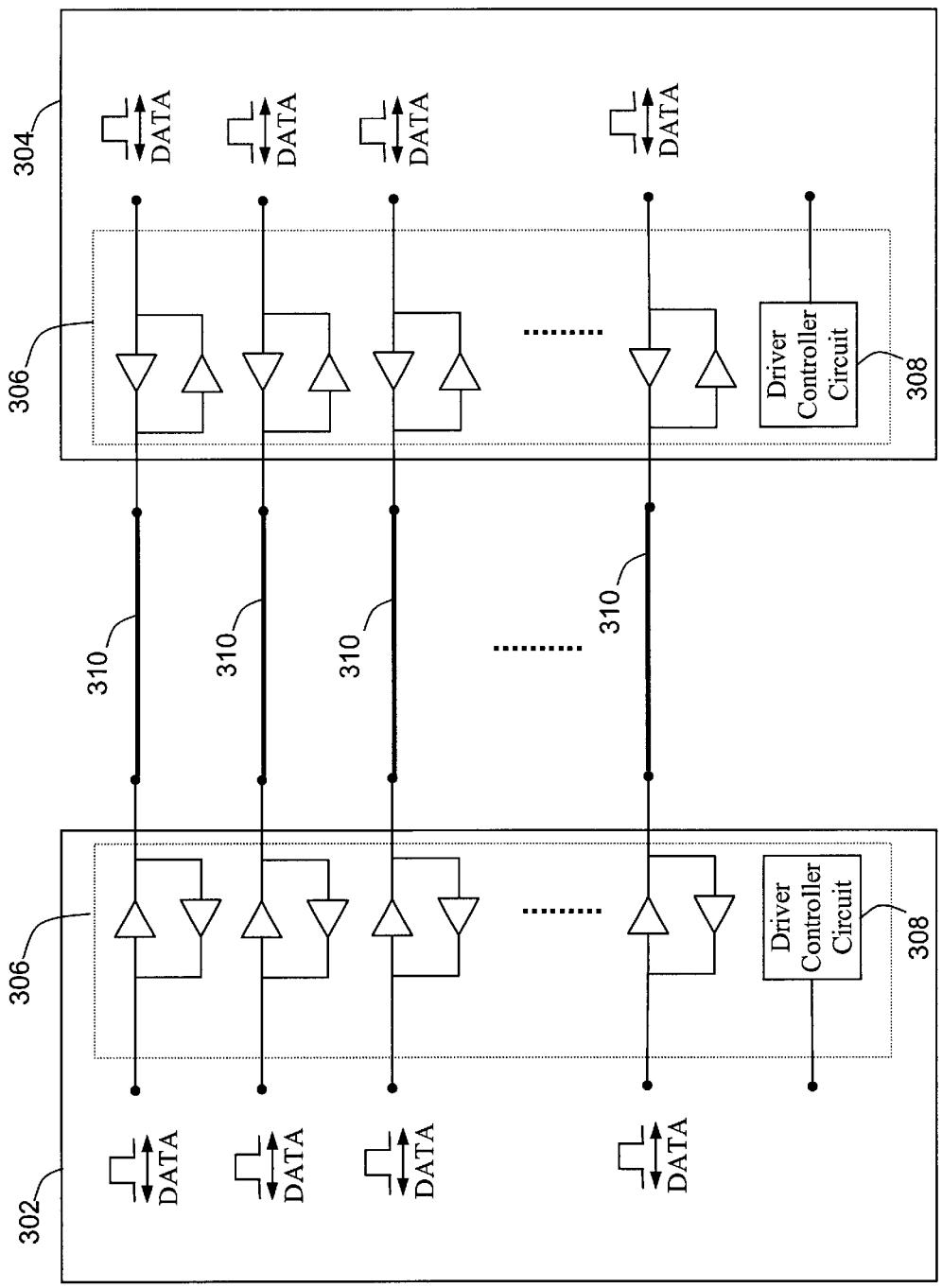
FIG. 4 is an illustration of two electronic devices including sub-modules of input/output driver circuits.

FIG. 4 illustrates an embodiment of the interconnection between two electronic devices 302 & 304, each comprising a plurality of semiconductor integrated circuits and the driver circuits 306 present within each of these devices. It is contemplated that an electronic device employing the driver circuit as shown may be implemented within a wide variety of communication products. Examples of a "communication product" include, but are not limited or restricted to a computer (e.g., desktop, laptop, server, workstation, mainframe), a hand-held device (e.g., personal digital assistant, wireless handset), a set-top box, a networking device (e.g., router, bridge, hub, switch) and the like.

Electronic devices 302 & 304, such as buffers, DRAM chips and controllers for example, have internal driver circuits 306. Driver circuits 306 typically serve the purpose of supporting transmissions to and from the device 306. Each transmission line 310 to and from a device 302 & 304 typically has one input and output driver circuit to facilitate transmissions across the transmission line. The operation of the driver circuits is controlled by a driver controller circuit 308 which is in turn controlled by each electronic device 302 & 304.

Figure 5:
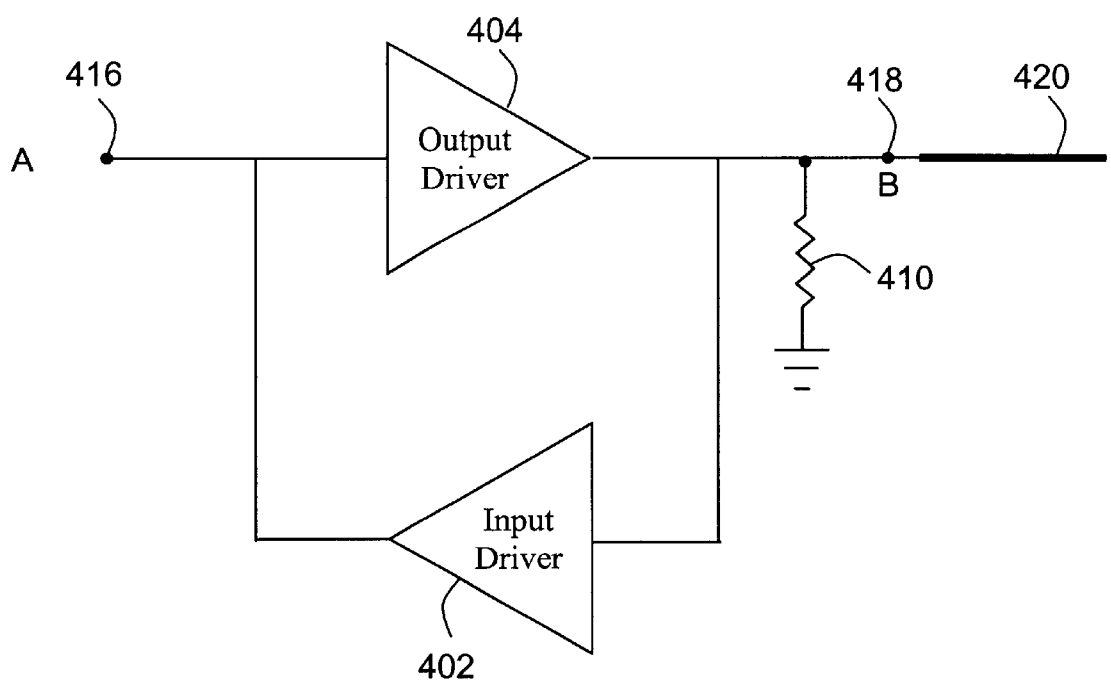
FIG. 5 is a system-level schematic illustrating a driver circuit with an external termination resistor.

FIG. 5 illustrates an individual input driver circuit 402 and output driver circuit 404 typically found within electronic devices such as semiconductor integrated circuits. Herein, a bidirectional signal driver circuit allows an electronic device to transmit signals, from node A 416 to node B 418, and receive signals, from node B 418 to node A 416, to and from the same transmission line. When the electronic device transmits a signal, the output driver circuit 404 is enabled and the input driver circuit 402 is disabled. When not transmitting data, the input driver circuit 402 is typically enabled and the output driver circuit 404 is disabled. A driver controller circuit, similar to the driver controller circuit 308 depicted in FIG. 4, would control when to enable or disable each input 402 and output driver circuit 404. In order to avoid signal reflection when receiving transmission signals, an external termination resistor 410 is coupled to each individual transmission line 420.

Figure 6:
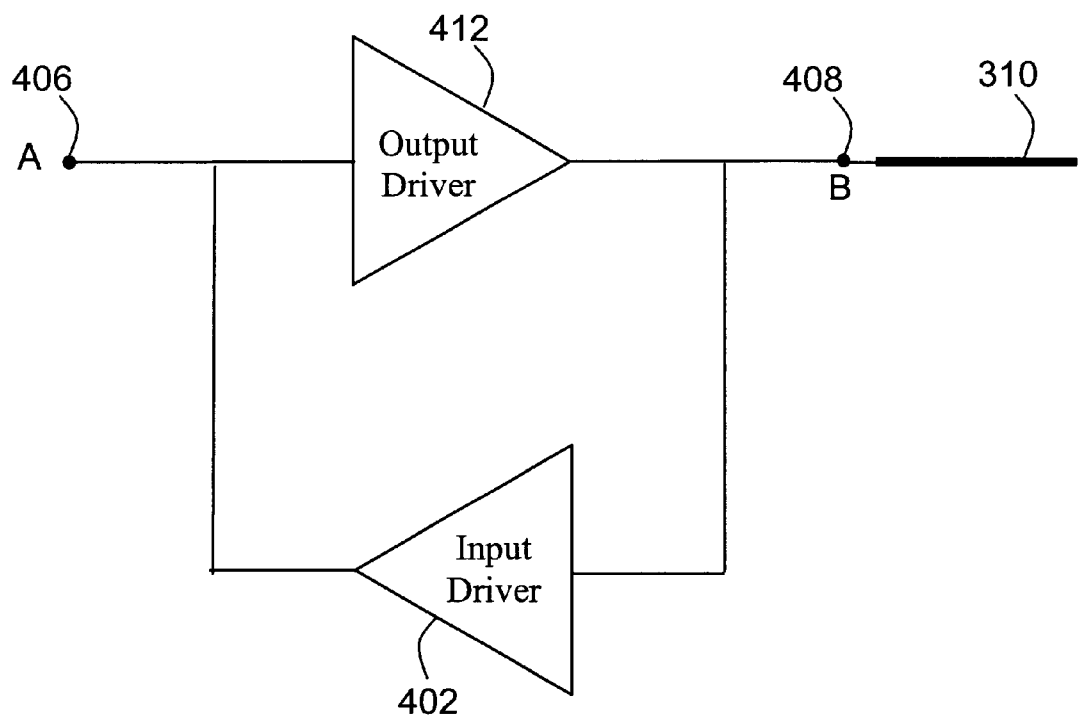
FIG. 6 is a system-level schematic illustrating the present invention where a driver circuit does not require a discrete termination resistor to prevent signal reflection.

FIG. 6 is an embodiment of an input driver circuit 402 and output driver circuit 412 of the present invention. As shown, the input driver circuit 402, comprising a first interface at node B and a second interface at node A, and output driver circuit 412, comprising a third interface at node B and a fourth interface at node A, do not require that an external termination resistor 410 (in FIG. 5) be coupled to the transmission line 310 to avoid signal reflection. Instead, the output driver circuit 412 is designed to serve dual roles. In a first mode of operation, the output driver circuit 412 operates as a conventional signal driver, transmitting a signal out to the transmission line 310. In a second mode of operation, when not transmitting, the output driver circuit 412 operates as a termination impedance to avoid reflection of incoming signals. Thus, the output driver circuit 412 operates as an active termination impedance when the input driver circuit 402 is receiving transmission signals. In this manner, the present invention does not require that an external termination resistor 410 (in FIG. 5) be utilized for preventing signal reflection.

Figure 7:
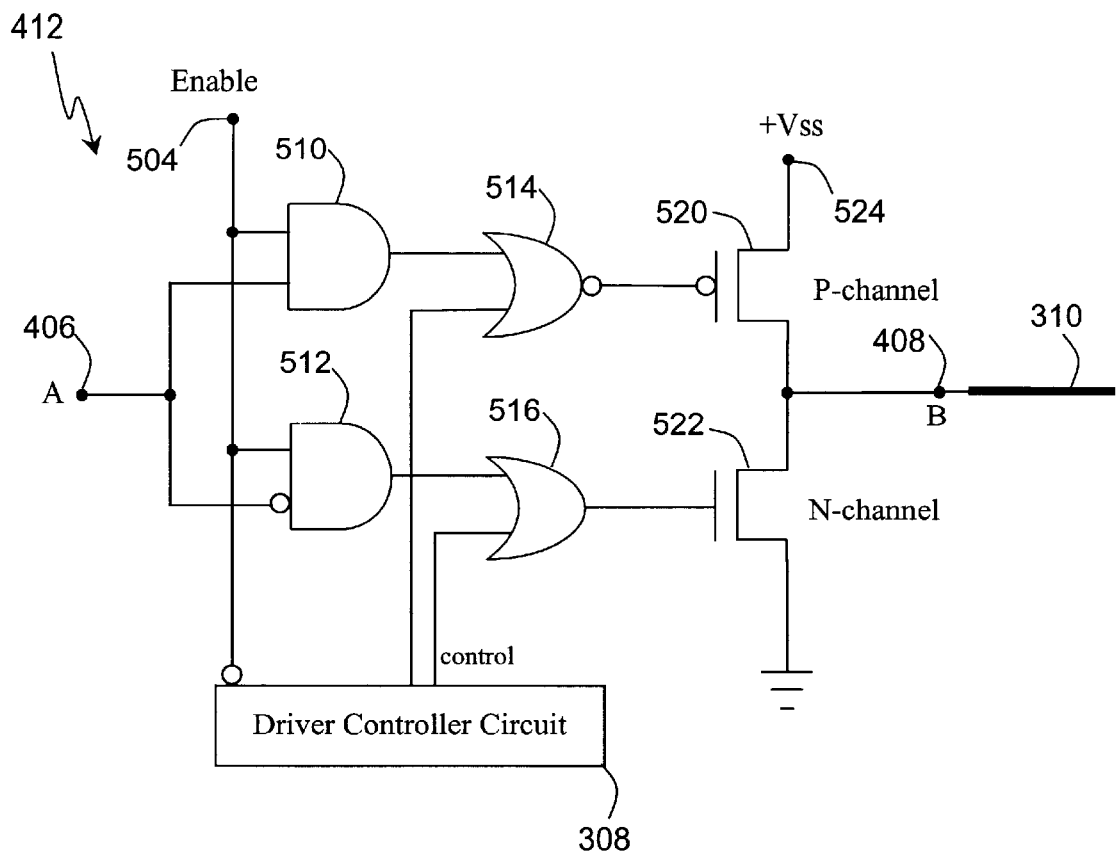
FIG. 7 is a component level schematic illustrating how the driver circuit of the present invention is configured to achieve its dual purpose.

According to one embodiment of the present invention, the output driver circuit 412 of FIG. 6 is illustrated at the component level in FIG. 7. A P-channel field effect transistor (FET) 520 and a N-channel FET 522 are configured as a push-pull output stage voltage regulator to drive the signal present at node A 406 out to the transmission line 310 at node B 408. The voltage regulator may be configured by having the source of the P-channel FET 520 coupled to a voltage source +Vss 524, the source of the N-channel FET 522 coupled to ground, and the drains of the P-channel FET 520 and the N-channel FET 522 connected together at a junction leading to an output terminal illustrated in FIG. 7 as node B 408. In an embodiment of the present invention, the source of the N-channel FET 522 may be coupled to a voltage source −Vss rather than ground. Voltage source −Vss may be of equal magnitude to voltage source +Vss 524 and opposite potential. According to another embodiment, voltage sources +Vss 524 and −Vss may be of different magnitudes. Another embodiment of the invention may have voltage sources +Vss 524 and −Vss having the same potential and different magnitudes.

The operation of this output driver circuit 412 is controlled through the gates of the P-channel FET 520 and N-channel FET 522. In one embodiment, shown in FIG. 7, AND logic gates and OR logic gates are configured to allow the biasing of the gates of the P-channel FET 520 and N-channel FET 522 by either the signal at node A or by the driver controller circuit. Of course, there are several ways in which a logic circuit may be designed to achieve this purpose.

A shown in this embodiment, node A 406 is couple to both a first input of a first AND logic gate 510 and a first, inverted input of a second AND logic gate 512. An Enable line 504 is coupled to a second input of the first 510 and second AND logic gates 512 as well as an inverted input of the driver controller circuit 308.

An output of the first AND logic gate 510 is coupled to a first input of a NOR logic gate 514 while a second input of the NOR logic gate 514 is coupled to receive control signals from the driver controller circuit 308. The output of the NOR logic gate 514 is coupled to the gate of the P-channel FET 520 to control its activation or deactivation. Similarly, an output of the second AND logic gate 512 is coupled to a first input of an OR logic gate 516 while a second input of the OR gate 516 is coupled to receive control signals from the driver controller circuit 308. The output of the OR gate 516 is coupled to the gate of the N-channel FET 522.

The operations of the output driver circuit 412 in FIG. 7 are described in FIG. 8. Note that the terms HIGH and LOW do not indicate particular voltage levels but are only used to describe a two-state system. Therefore, a signal level recognized as HIGH or "1" at node A may have a different voltage value than HIGH or "1" at node B.

When the driver circuit is in transmitting mode, the output node B 408 mirrors the input node A 406. That is, when the signal present at node A 406 is HIGH, the gate of the P-channel FET will be biased and a signal HIGH will be present at node B 408. When the driver is receiving, an Enable line 504 is set by the device 302. This Enable line 504 may be pulled LOW to indicate to the driver controller circuit 308 that a termination impedance is desired at node B 408. The driver controller circuit 308 is then capable of causing the gates of the P-channel FET 520 and N-channel FET 522 to be biased and produce an active impedance to terminate the transmission line 310. From the point of view of transmission signals coming into node B 408 from a second device 304, the impedance provided by the output driver circuit 412 functions just like a termination resistor.

Impedance matching typically requires that the termination resistor closely match the characteristic impedance $Z_0$ of the signal transmission path 310. Generally, the higher the operating frequency, the closer the termination impedance must match the characteristic impedance of the transmission line 310. Impedance matching may be accomplished by selecting P-channel FETs and N-channel FETs of appropriate size such that their impedance provides a match to the characteristic impedance of the transmission line. Such selection may be made by means of internal or external configuration lines to the driver circuit 306.

Figure 9:
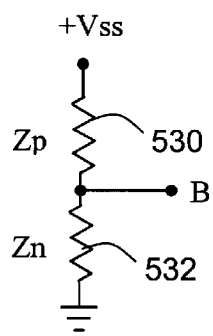
FIG. 9 is a conceptual representation of a P-channel transistor and N-channel transistor configured as an active impedance.

FIG. 9 is a conceptual representation of the termination impedance, provided by the P-channel and N-channel FETs of FIG. 7. When both transistors are biased, the P-channel FET may be characterized as an impedance Zn 530 and the N-channel FET may be characterized as an impedance Zn 532. The exact impedance of this network, consisting of the P-channel and N-channel FETs, is determined by the ratio of the P-channel and N-channel FETs and the sizes of those transistors.

Figure 10:
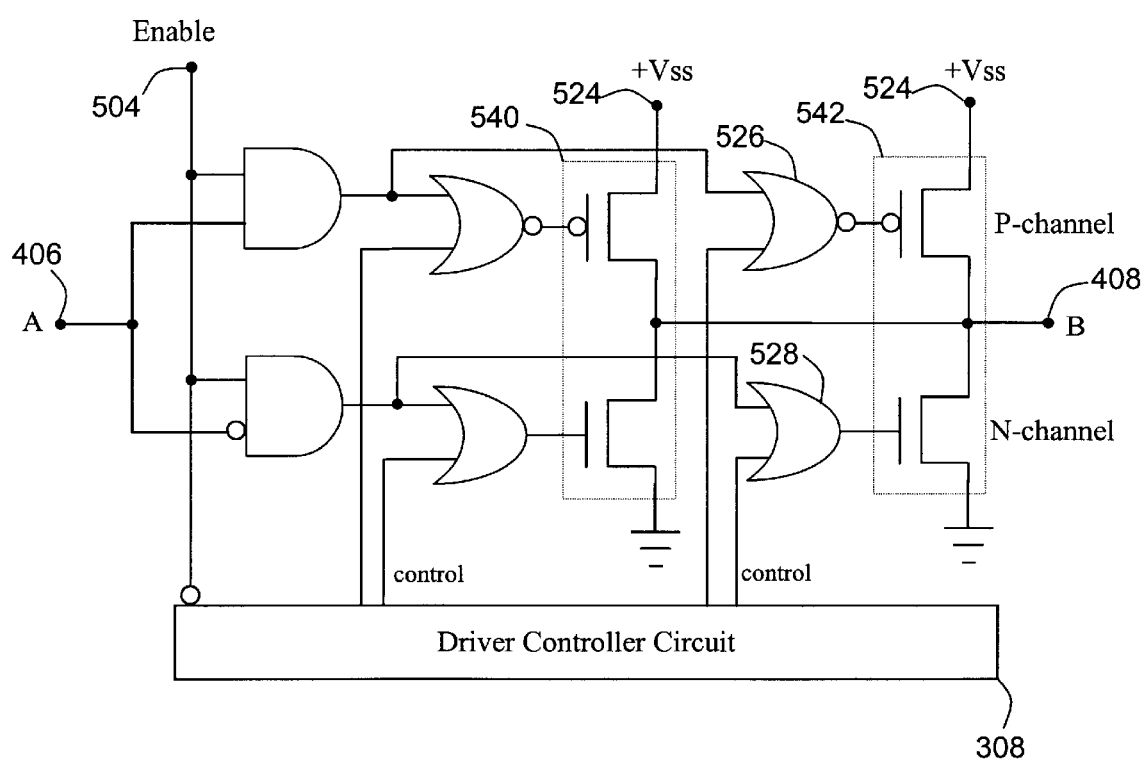
FIG. 10 is a component level schematic illustrating how an alternative embodiment of the driver circuit of the present invention is configured to achieve its dual purpose.

According to an alternative embodiment of the invention, shown in FIG. 10, a plurality of P-channel and N-channel FET pairs 540 & 542 may be employed at an output driver circuit 412 as depicted in FIG. 6. Each pair of P-channel and N-channel FETs is herein defined as a 'leg'. While two legs 540 & 542 are shown in FIG. 10, this is merely for simplicity and not a limitation of the invention. In fact, a greater number of legs may be accommodated by this design. When transmitting a data signal, the output driver circuit 412 may utilize a plurality of legs to drive the signal to output port B 408. In receiving mode, a plurality of legs 540 & 542 in the output driver circuit 412 may be reconfigured to provide termination impedance as previously described with reference to a single leg.

Impedance matching may be provided by the driver controller circuit 308 by biasing one or both of the available legs 540 & 542. As shown in FIG. 10, each leg may be individually biased by the driver controller circuit 308. Each leg may have FETs of different sizes thus having different impedance from each other when both FETs are biased. The driver controller circuit 308 may have internal or external configuration lines which may be utilized to indicate the desired impedance value.

Because the driver controller circuit 308 may bias any leg 540 & 542 individually, it may be configured to match the characteristic impedance of a particular transmission line 310 by selecting a combination of legs which provide the desired impedance value. For example, in FIG. 10, the controller 308 may be configured to select the first leg 540, the second leg 542, or both legs depending on the termination impedance value desired. The driver controller circuit 308 can thus be configured to provide various termination impedance values as required by each application.

According to one embodiment of the invention, termination impedance may be provided by a series of legs which have linearly increasing impedance. That is, each leg may have an impedance which is greater than a preceding leg by a fix amount. Similarly, termination impedance may be provided by a set of legs which have a logarithmically increasing impedance. Each leg may have an impedance which is greater than a preceding leg by an order of magnitude.

The driver circuit of the present invention is not limited to operating at any particular frequency. In fact, the invention is intended to be used in high frequency applications, such as signal transmissions on computer memory applications. Thus, according to one embodiment of the invention, the driver circuit may be capable of operating at a frequency range of 10 megahertz up to 1000 megahertz. In another embodiment of the invention, the circuit may be capable of operating at a frequency range of 100 megahertz up to 900 megahertz. In another embodiment, the driver circuit may be capable of transmitting and receiving at frequencies around 400 megahertz. All of these frequencies and ranges are by way of example and are not to be construed as a limitation on the invention.

While the invention has been described and illustrated in detail, it is to be clearly understood that this is intended by way of illustration and example only and is not to be taken by way of limitation, the spirit and scope of this invention being limited only by the terms of the following claims.

What is claimed is:

1. A driver circuit, comprising:
   an input driver circuit including a first interface to receive signals and a second interface to transmit signals; and
   an output driver circuit including a third interface coupled to the first interface of the input driver circuit and a fourth interface coupled to the second interface of the input driver circuit, the output driver circuit, in a first mode of operation, drives signals received at the fourth interface out of the third interface and, in a second mode of operation, provides a plurality of active termination devices of linearly increasing impedance coupled to the third interface and individually configurable to provide termination impedance to avoid reflection of signals received at the first interface of the input driver circuit.

2. The driver circuit of claim 1, further comprising a driver controller circuit to couple the to the output driver circuit, the driver controller circuit to place the output driver circuit in one of the first mode of operation or the second mode of operation.

3. The driver circuit of claim 1, wherein the output driver circuit comprises a first and a second field effect transistors of opposite conductivity types having their drains coupled to the third interface, a source of the first field effect transistor coupled to a voltage supply, a source of the second field effect transistor coupled to ground.

4. The driver circuit of claim 3, wherein the sizes of the first and second field effect transistors are selected to closely match a characteristic impedance of a transmission line.

5. The driver circuit of claim 1, wherein the multiple active termination devices include a plurality of field effect transistors coupled to the third interface.

6. The driver circuit of claim 1 being implemented within an electronic device.

7. The driver circuit of claim 1 being implemented within a semiconductor integrated circuit.

8. The driver circuit of claim 1 being implemented within a computer memory module.

9. The driver circuit of claim 1 being implemented within a dynamic random access memory chip.

10. The driver circuit of claim 1 being implemented within a buffer component.

11. A semiconductor integrated circuit, comprising an output driver circuit including
   a first interface to couple to a transmission line, and
   a plurality of active termination devices coupled to the first interface to drive an output signal in a first mode of operation and individually configurable to provide a termination impedance of one of a plurality of linearly increasing values in a second mode of operation to avoid reflection of signals received at the interface of an input driver circuit.

12. The semiconductor integrated circuit of claim 11, wherein the output driver circuit including a fourth interface to receive a signal.

13. The semiconductor integrated circuit of claim 12, wherein an input driver circuit having a first interface coupled to the third interface of the output driver circuit and a second interface coupled to the fourth interface of the output driver circuit.

14. The semiconductor integrated circuit of claim 13, wherein the value of the termination impedance is set by input lines of the semiconductor integrated circuit.

15. A method of providing termination impedance within a driver circuit, comprising:

directing an output driver circuit to drive an output signal when in transmitting mode; and configuring the output driver circuit to provide a plurality of linearly increasing and individually configurable active termination impedances when in receiving mode to avoid reflection of signals.

16. The method of claim 15, further comprising:

matching the termination impedances to a characteristic impedance of a transmission line to which it is coupled.

17. The method of claim 16, further comprising:

matching the termination impedances to the characteristic impedance of the transmission line to which it is coupled to within twenty percent accuracy.

18. The method of claim 16, further comprising:

matching the termination impedances to the characteristic impedance of the transmission line to which it is coupled to within ten percent accuracy.

19. The method of claim 17, further comprising:

matching the termination impedances to the characteristic impedance of the transmission line to which it is coupled to within three percent accuracy.

20. The method of claim 17, further comprising:

indicating to the output driver circuit that a termination impedance is desired.

21. A driver circuit, comprising:

an input driver circuit including a first interface to receive signals and a second interface to transmit signals; and an output driver circuit including a third interface coupled to the first interface of the input driver circuit and a fourth interface coupled to the second interface of the input driver circuit, the output driver circuit, in a first mode of operation, drives signals received at the fourth interface out of the third interface and, in a second mode of operation, provides a plurality of active termination devices of logarithmically increasing impedance coupled to the third interface and individually configurable to provide termination impedance to avoid reflection of signals received at the first interface of the input driver circuit.

22. The driver circuit of claim 21, further comprising a driver controller circuit to couple the to the output driver circuit, the driver controller circuit to place the output driver circuit in one of the first mode of operation or the second mode of operation.

23. The driver circuit of claim 21, wherein the output driver circuit comprises a first and a second field effect transistors of opposite conductivity types having their drains coupled to the third interface, a source of the first field effect transistor coupled to a voltage supply, a source of the second field affect transistor coupled to ground.

24. The driver circuit of claim 23, wherein the sizes of the first and second field affect transistors are selected to closely match a characteristic impedance of a transmission line.

25. The driver circuit of claim 21, wherein the multiple active termination devices include a plurality of field effect transistors coupled to the third interface.

26. A semiconductor integrated circuit, comprising an output driver circuit including a first interface to couple to a transmission line, and a plurality of active termination devices coupled to the first interface to drive an output signal in a first mode of operation and individually configurable to provide a termination impedance of one of a plurality of logarithmically increasing values in a second mode of operation to avoid reflection of signals received at the interface of an input driver circuit.

27. The semiconductor integrated circuit of claim 26, wherein the output driver circuit including a fourth interface to receive a signal.

28. The semiconductor integrated circuit of claim 27, wherein an input driver circuit having a first interface coupled to the third interface of the output driver circuit and a second interface coupled to the fourth interface of the output driver circuit.

29. The semiconductor integrated circuit of claim 28, wherein the value of the termination impedance is set by input lines of the semiconductor integrated circuit.

* * * * *

UNITED STATES PATENT AND TRADEMARK OFFICE
CERTIFICATE OF CORRECTION

PATENT NO. : 6,369,605 B1
DATED : April 9, 2002
INVENTOR(S) : Bonella et al.

It is certified that error appears in the above-identified patent and that said Letters Patent is hereby corrected as shown below:

Column 5,
Line 13, delete "Zn", insert -- Zp --.

Signed and Sealed this

Twenty-sixth Day of November, 2002

Attest:

Attesting Officer

JAMES E. ROGAN
Director of the United States Patent and Trademark Office